(12) United States Patent
Chua et al.

(10) Patent No.: US 8,859,333 B2
(45) Date of Patent: Oct. 14, 2014

(54) INTEGRATED CIRCUIT PACKAGE AND A METHOD FOR DISSIPATING HEAT IN AN INTEGRATED CIRCUIT PACKAGE

(75) Inventors: Kok Hua Simon Chua, Singapore (SG); Budi Njoman, Singapore (SG)

(73) Assignee: LSI Corporation, Milpitas, CA (US)

( * ) Notice: Subject to any disclaimer, the term of this patent is extended or adjusted under 35 U.S.C. 154(b) by 1472 days.

(21) Appl. No.: 12/518,877

(22) PCT Filed: Dec. 12, 2006

(86) PCT No.: PCT/US2006/047360
§ 371 (c)(1),
(2), (4) Date: Nov. 29, 2009

(87) PCT Pub. No.: WO2008/073084
PCT Pub. Date: Jun. 19, 2008

(65) Prior Publication Data
US 2010/0120206 A1     May 13, 2010

(51) Int. Cl.
| | | |
|---|---|---|
| H01L 21/00 | (2006.01) |
| H01L 21/16 | (2006.01) |
| H01L 23/367 | (2006.01) |
| H01L 23/13 | (2006.01) |
| H01L 23/31 | (2006.01) |
| H01L 23/433 | (2006.01) |
| H01L 21/56 | (2006.01) |
| H01L 23/00 | (2006.01) |

(52) U.S. Cl.
CPC ... *H01L 23/3675* (2013.01); *H01L 2924/01006* (2013.01); *H01L 2924/01079* (2013.01); *H01L 2224/48247* (2013.01); *H01L 2924/01082* (2013.01); *H01L 23/13* (2013.01); *H01L 2224/83385* (2013.01); *H01L 23/3128* (2013.01); *H01L 23/4334* (2013.01); *H01L 2224/73265* (2013.01); *H01L 2924/01023* (2013.01); *H01L 24/48* (2013.01); *H01L 2224/32225* (2013.01); *H01L 21/565* (2013.01); *H01L 2224/45144* (2013.01); *H01L 2924/01033* (2013.01); *H01L 24/32* (2013.01); *H01L 2224/48227* (2013.01); *H01L 2224/48091* (2013.01)
USPC ........... 438/106; 438/118; 438/122; 438/124; 438/127; 257/707; 257/787; 257/E21.499; 257/E21.502; 257/E21.504

(58) Field of Classification Search
USPC ......... 257/667, 687, 707, 712, 713, 717, 719, 257/787, E21.504, E23.124, E21.499, 257/E21.5, E21.501, E21.502, E21.503; 438/118, 112, 122, 124, 127, 106, 125, 438/126; 264/272.11, 272.17, 272.14; 29/841, 848, 856; 174/528, 521
See application file for complete search history.

(56) References Cited

U.S. PATENT DOCUMENTS

| | | |
|---|---|---|
| 5,397,917 A | 3/1995 | Ommen et al. |
| 5,441,684 A * | 8/1995 | Lee ............................... 264/135 |

(Continued)

FOREIGN PATENT DOCUMENTS

JP         07 283336 A     10/1995

*Primary Examiner* — Benjamin Sandvik
*Assistant Examiner* — Leslie Pilar Cruz
(74) *Attorney, Agent, or Firm* — Daniel J. Santos; Smith Risley Tempel Santos LLC

(57) ABSTRACT

An IC package that is suitable for surface mounting arrangements includes a heat spreader device that is coupled to a bottom portion of the package below the IC die. Coupling the heat spreader device to the bottom portion of the package reduces or eliminates the possibility that placement of the heat spreader device will result in the molding compound bleeding on top of the heat spreader device, and delamination at the footings of the heat spreader device that can cause the package to delaminate, or "popcorn".

17 Claims, 7 Drawing Sheets

(56) References Cited

U.S. PATENT DOCUMENTS

| | | | |
|---|---|---|---|
| 6,060,778 A * | 5/2000 | Jeong et al. | 257/710 |
| 2003/0160320 A1 | 8/2003 | Shieh et al. | |
| 2003/0206401 A1 | 11/2003 | Zhou et al. | |
| 2004/0161879 A1 * | 8/2004 | Tsai et al. | 438/122 |
| 2004/0262746 A1 | 12/2004 | Jung et al. | |
| 2005/0077545 A1 | 4/2005 | Zhao et al. | |
| 2007/0273023 A1 * | 11/2007 | Zhao et al. | 257/706 |
| 2008/0122068 A1 * | 5/2008 | Kelly et al. | 257/712 |

* cited by examiner

INTEGRATED CIRCUIT PACKAGE AND A METHOD FOR DISSIPATING HEAT IN AN INTEGRATED CIRCUIT PACKAGE

TECHNICAL FIELD OF THE INVENTION

The invention relates to integrated circuits (ICs). More particularly, the invention relates to a method and an apparatus for dissipating heat in an IC package.

BACKGROUND OF THE INVENTION

For packaged IC devices that are intended for use as surface mount devices, the current technique for dissipating heat in the package involves using a heat spreader device that is coupled to a top portion of the IC device. FIG. 1 illustrates a side cross-sectional view of a packaged IC device 2 positioned between top and bottom mold plates 3 and 4, respectively. The IC package 2 has a die 5 that is attached by a die attach material 6 to a die attach region 7 of a substrate 8 of a leadframe 11. Pads (not shown) on the die 5 are connected by electrical conductors (e.g., gold wires) 9 to the leadframe 11 of the package 2. A heat spreader device 12 extends over a top portion of the package 2 above the die 5 and has footings that are attached by an attachment material to the leadframe 11. The heat spreader device 12 is separated from the die 5 by a molding compound 13. When the molding compound 13 is cured, it solidifies and secures the heat spreader device 3 in the position depicted in FIG. 1.

The heat spreader device 12 must be precisely positioned on the top portion of the IC device 2 before the package is molded (i.e., encapsulated). If the heat spreader device 12 is not precisely positioned on the device 2 when the molding process is performed, the molding compound 13 may bleed or run (i.e., flow onto the top of the heat spreader device 12). Excessive mold bleed may impede the thermal dissipation property of the IC device 2. In addition, during mold clamping, there is a likelihood that the mold clamp will press onto the heat spreader device 12, which may result in delamination at the footings of the heat spreader device 12. Moisture may subsequently be trapped in the delaminated regions around the footings of the heat spreader device 12 that might, in turn, result in "pop corning". "Pop corning" can lead to mechanical damage to the IC device 2 and prevent it from operating properly.

FIG. 2 illustrates a flowchart that represents the current assembly process for packaging the IC device shown in FIG. 1 and preparing it for mounting via SMT to a printed circuit board (PCB). A wafer having many IC dies is subjected to a back grinding process during which the wafer is thinned, as indicated by block 21. Thinning the wafer reduces the final IC package size and lowers the thermal resistance of the final IC package. The wafer is then diced into individual dies, as indicated by block 22. The die is then attached to the leadframe substrate with a paste during a die attach process, as indicated by block 23. The die attach paste is then cured, as indicated by block 24. The pads of the die are then bonded to the conductors of the leadframe during a wire bonding process, as indicated by block 25. The heat spreader device is then attached, as indicated by block 26. Attaching the heat spreader device involves placing an attachment material at particular locations on the leadframe, and precisely positioning the heat spreader device above the die such that the feet of the legs of the heat spreader device are in contact with the attachment material. The attachment material is then cured, as indicated by block 27, which secures the feet of the legs of the heat spreader device to the leadframe. The IC device is then subjected to the molding process, as indicated by block 28.

After the molding process has been performed, the package is typically subjected to a laser marking process that marks the package with some indicia (e.g., part name and number), as indicated by block 29. The package is then subjected to a post-mold curing process, as indicated by block 31. When used in SMT, the package leadframe is typically next subjected to a solder ball mounting process, as indicated by block 32, which places solder balls on the leadframe that will subsequently be used to solder the leadframe to a PCB. A singulation process is then performed, as indicated by block 33, which separates the leadframe of the IC package from the other leadframes intended to be connected to other like IC devices to form other like IC packages. The IC package leadframe is now ready to be connected via soldering to a PCB during a subsequent mounting process (not shown).

As described above, if the heat spreader device is not precisely positioned before the molding process (block 8) begins, the molding compound (e.g., resin) may bleed or run during the molding process, which may impede the thermal dissipation performance of the package. The clamp force acting on the heat spreader device may also lead to delamination on the footings of the heat spreader device which might lead to "pop corning" at some later time (e.g., during solder ball mount reflow or after it has been mounted to the PCB).

Another technique that has been proposed to prevent this problem is to use a molding compound that has a high thermal conductivity. Using a mold compound of high thermal conductivity can improve the thermal performance of the device. Using this compound, however, usually results in a high degree of wire sway occurring during the molding process and high package warp. A high degree of warp will result in processing difficulties, such as ball short, for example, during mounting of the IC device to the PCB. This technique has not fully matured and has not been widely adopted in the IC fabrication industry.

Accordingly, a need exists for a way to incorporate a heat spreader device into an IC device that obviates problems such as mold bleed, delamination, a high degree of wire sweep, and a high degree of warping of the final IC package.

SUMMARY OF THE INVENTION

The invention provides an IC package and a method for dissipating heat in an IC package. The IC package comprises a substrate, an IC die, and a heat spreader device. The substrate has a top surface and a bottom surface and an opening formed therein. The IC die has a top surface and a bottom surface. The top surface of the die has one or more conductive pads disposed on it. The top surface of the heat spreader device is coupled to the bottom surface and substantially covers the opening formed in the substrate and is coupled with or adjacent to the bottom surface of the die.

In accordance with one embodiment, the method comprises forming an opening in a substrate at a die placement location, and coupling a top surface of a heat spreader device to a bottom surface of the substrate adjacent the opening.

In accordance with another embodiment, the method comprises forming an opening in a substrate at a die placement location, covering the opening and at least a portion of a bottom surface of the substrate with an adhesive tape material, subsequent to covering the opening and bottom surface of the substrate with the adhesive tape material, removing the tape material, and placing a top surface of a heat spreader device in contact with the adhesive material on the bottom surface of the substrate such that when the adhesive material cures, the top surface of the heat spreader device is coupled to the bottom surface of the substrate.

These and other features and advantages of the invention will become apparent from the following description, drawings and claims.

DETAILED DESCRIPTION OF ILLUSTRATIVE EMBODIMENTS

In accordance with the invention, an IC package that is suitable for surface mounting arrangements includes a heat spreader device that is coupled to a bottom portion of the package below the IC die. Securing the heat spreader device to the bottom portion of the package reduces or eliminates the possibility that placement of the heat spreader device will result in the molding compound bleeding on top of the heat spreader device or delamination at the footings of the heat spreader device, which can cause the package to "popcorn". The heat spreader device may be coupled to the package prior to or subsequent to the molding process being performed, as will now be described with reference to a few illustrative embodiments of the invention.

Figure 3:
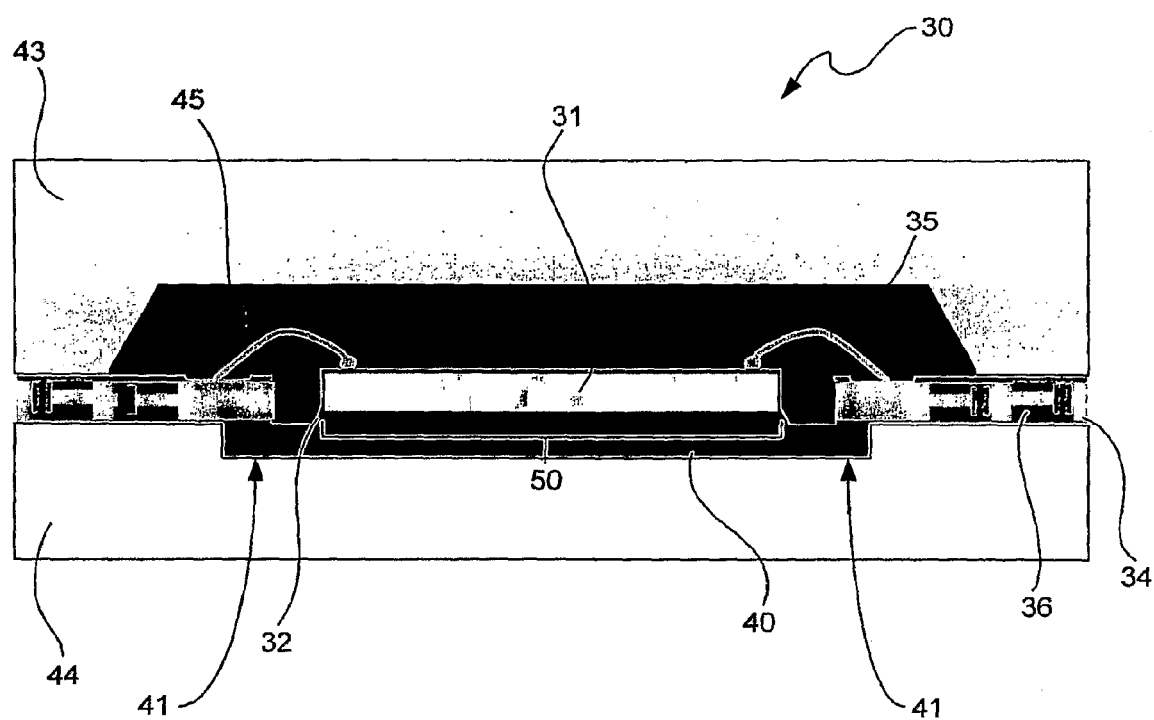
FIG. 3 illustrates a side cross-sectional view of a packaged IC device in accordance with an illustrative embodiment of the invention having a heat spreader device coupled to a bottom portion thereof.

FIG. 3 illustrates a cross-sectional view of an IC package 30 in accordance with an illustrative embodiment being subjected to a molding process. The package 30 is similar to the package 2 shown in FIG. 1 in that it includes a die 31 that is coupled by a die attach material 32 to a substrate 34 of a leadframe 36, and pads (not shown) that are connected by electrical conductors (e.g., gold wires) 35 to conductors (not shown) of a leadframe 36. The substrate 34 of the leadframe 36 functions as an insulating layer for insulating the die 31 from the conductors of the leadframe 36. In accordance with the invention, the package 30 includes a heat spreader device 40 that is coupled to a bottom portion of the package 30.

In accordance with this embodiment, the heat spreader device 40 is coupled at some time prior to the molding process being performed adjacent the die 31. The substrate 34 has an opening formed therein at the bottom portion of the package 30, and the die 31 is in contact with the heat spreader device 40 over the region 50 where the die 31 and the heat spreader device 40 interface with this opening.

Outer portions 41 of the heat spreader device 40 are coupled by some attachment device or material (not shown) to the leadframe 36 to provide a thermal path from the die 31 to the leadframe 36 for heat dissipation. The inner surface of the top mold plate 43 is in contact with molding compound 45, which is contact with the die 31 and other portions of the package 30. The inner surface of the bottom mold plate 44 is not in contact with the molding compound 45, but is in contact with the heat spreader device 40 and other portions of the package 30. The inner surface of the bottom mold plate 44 is shaped to match the shape of the bottom surface of the heat spreader device 40 and other portions of the package 30 that the inner surface of the mold plate 44 abuts during the molding process. Thus, the placement of the heat spreader device 40 has no affect on the molding compound 45 and thus will not result mold bleed.

Figure 2:
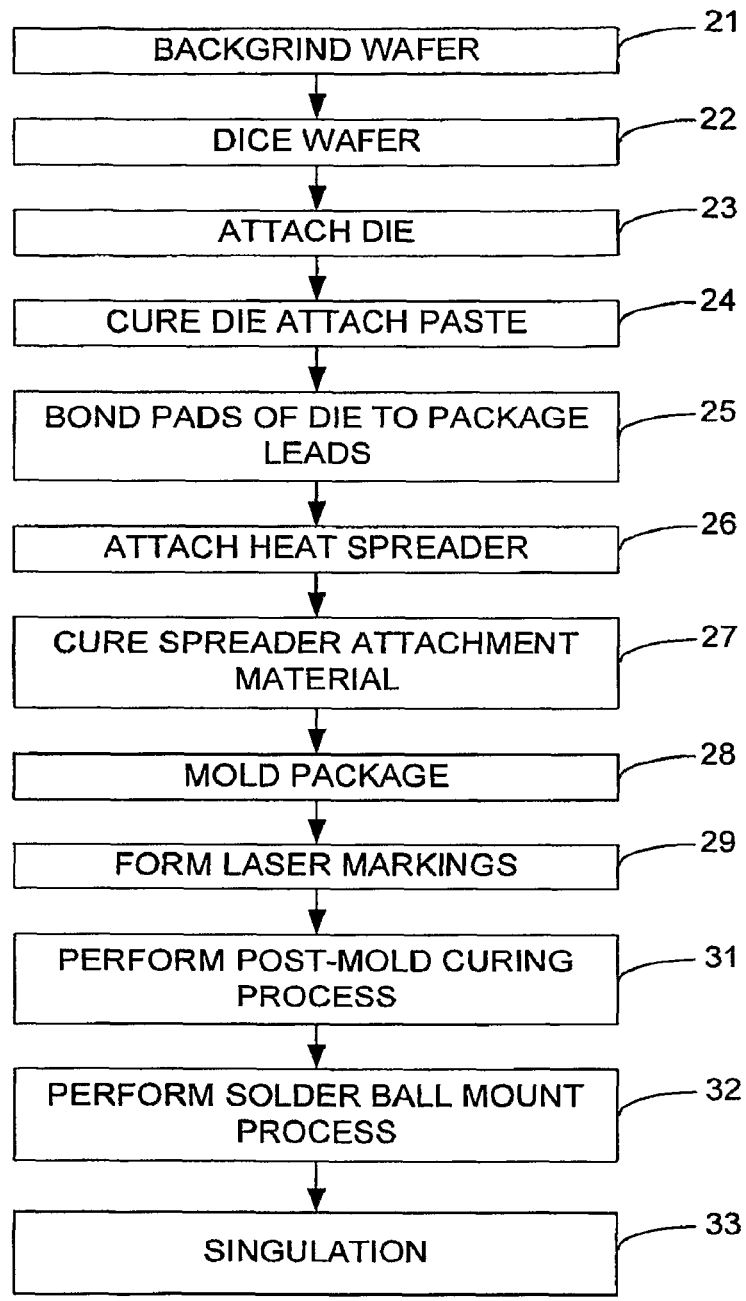
FIG. 2 illustrates a flowchart that represents the current assembly process for creating the IC package shown in FIG. 1 and preparing it to be mounted via SMT to a PCB.
Figure 4:
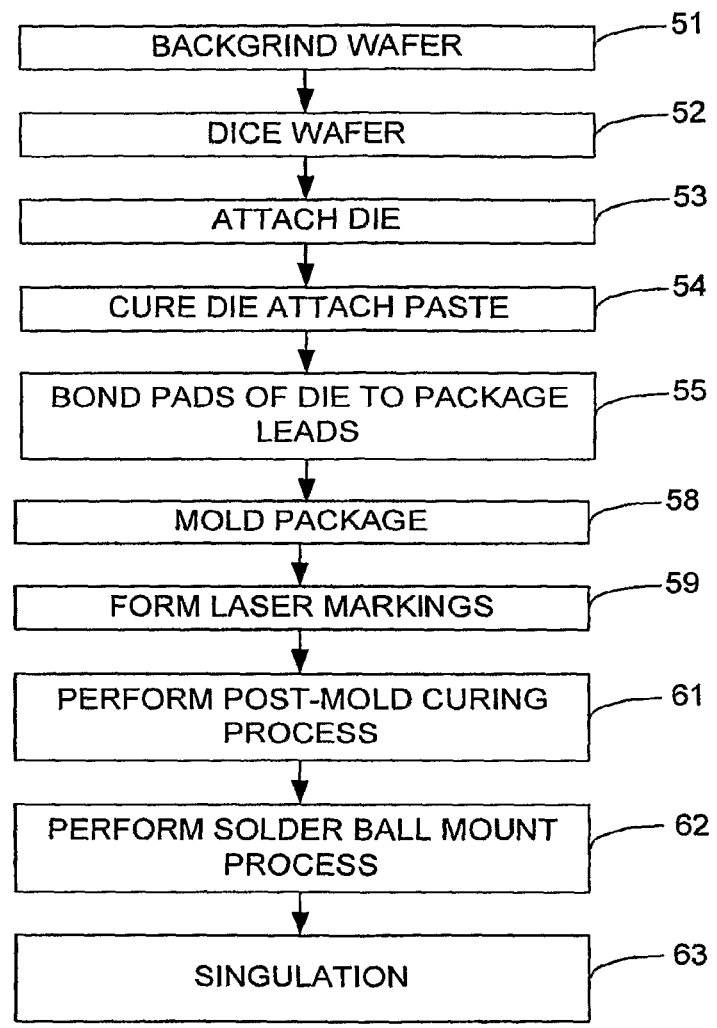
FIG. 4 illustrates a flowchart that represents the assembly process of the invention in accordance with an illustrative embodiment for packaging an IC and preparing it to be mounted via SMT to a PCB.

FIG. 4 illustrates a flowchart that represents the assembly process of the invention in accordance with an illustrative embodiment for packaging an IC and preparing it to be mounted via SMT to a PCB. The flowchart shown in FIG. 4 is identical to the flowchart shown in FIG. 2 except that blocks 26 and 27 in FIG. 2, which are associated with coupling the heat spreader device and curing the attachment material, have been eliminated. This is because, in accordance with this embodiment of the invention, the heat spreader device is coupled prior to the assembly process being performed. Blocks 51-55 shown in FIG. 4 correspond, respectively, to blocks 21-25 shown in FIG. 2. Likewise, blocks 58-63 shown in FIG. 4 correspond, respectively, to hocks 28-33 shown in FIG. 2.

Figure 5:
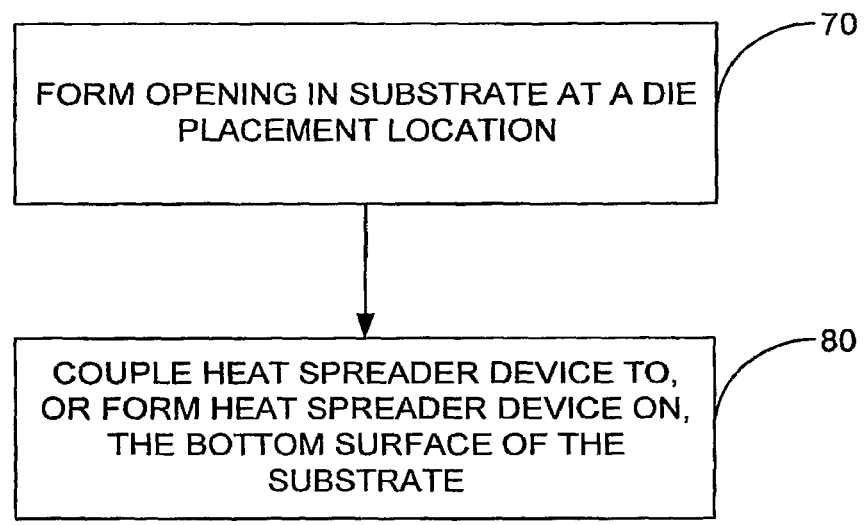
FIG. 5 illustrates a flowchart that represents the process of the invention in accordance with one illustrative embodiment for forming an opening in a substrate and coupling a heat spreader device to the bottom surface of the substrate below the opening.

FIG. 5 illustrates a flowchart that represents the process of the invention in accordance with one illustrative embodiment for forming an opening in a substrate of an IC device and coupling a heat spreader device to the bottom surface of the substrate below the opening. An opening is formed in a substrate of an IC device on a bottom portion of the IC device at a die placement location, as indicated by block 70. This may be performed at the wafer level or at the die level. If the process represented by block 70 is performed as part of the assembly process represented by FIG. 4, the openings could be formed, for example, after the backgrinding process corresponding to block 51 has been performed, but before the dicing process represented by block 52 is performed. Alternatively, the openings may be performed, for example, after the wire bonding process represented by block 55 has been performed, but before the molding process represented by block 58 has been performed. The invention is not limited with regard to when the opening is formed.

After the opening in the substrate has been formed, the heat spreader device is coupled to the bottom surface of the substrate, as indicated by block 80. This is typically accomplished by placing an attachment material, such as an adhesive film, on the bottom surface of the substrate and/or on the top surface of the heat spreader device. The top surface of the heat spreader device is then placed in abutment with the bottom surface of the substrate and the attachment material is cured, thereby bonding the top surface of the heat spreader device to the bottom surface of the substrate.

If the process represented by block 80 is performed as part of the assembly process represented by FIG. 4, the heat spreader device may be coupled, for example, after the wire bonding process represented by block 55 has been performed, but before the molding process represented by block 58 has been performed. The invention is not limited with regard to when the heat spreader device is coupled. If, however, the heat spreader device is coupled prior to the assembly process represented by FIG. 4 being performed, or during the performance of the assembly process, but before the molding process is performed, the possibility of mold bleed occurring is greatly reduced or eliminated altogether. The heat spreader device can be precisely positioned on the bottom surface of the substrate and coupled by a film adhesive prior to the molding process being performed. Subsequently, the die is coupled through the opening formed in the substrate directly to the top surface of the heat spreader device during the die attach process represented by blocks 53 and 54.

Figure 1:
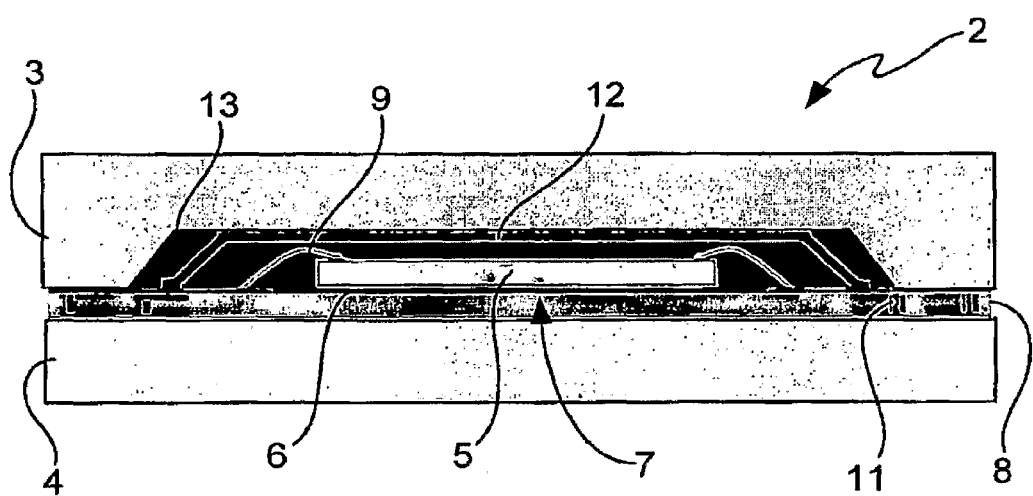
FIG. 1 illustrates a side cross-sectional view of a known IC device positioned between top and bottom mold plates during an assembly process, and having a heat spreader device attached to a top portion thereof.

Regardless of when the heat spreader device is coupled, positioning the heat spreader device below the die in accordance with the invention greatly reduces the length of the thermal path from the die to the heat spreader device in comparison to the length of the thermal path from the die to the heat spreader device when it is located above the die as depicted in FIG. 1. It is not necessary for the die to be seated directly on the top surface of the heat spreader device, although this is desirable in that it minimizes the length of the thermal path from the die to the heat spreader device. Rather, the size of the opening may be slightly smaller than the size of the die such that the die sits on the top surface of the substrate and is separated from the top surface of the heat spreader device by a distance equal to the thickness of the substrate where the opening is formed. In the latter case, a material of high thermal conductivity may be located within the opening and in contact with the bottom surface of the die and the top surface of the heat spreader device. Both of these arrangements greatly reduce the length of the thermal path from the die to the heat spreader device located below the die in comparison to the length of the thermal path when the heat spreader device is located above the die as depicted in FIG. 1.

It should also be noted that it is not necessary that the opening be formed prior to the heat spreader device being coupled. The heat spreader device may be coupled prior to the opening being formed in the substrate. Thus, the order of the blocks 70 and 80 may be the reverse of the order depicted in FIG. 5.

Figure 6:
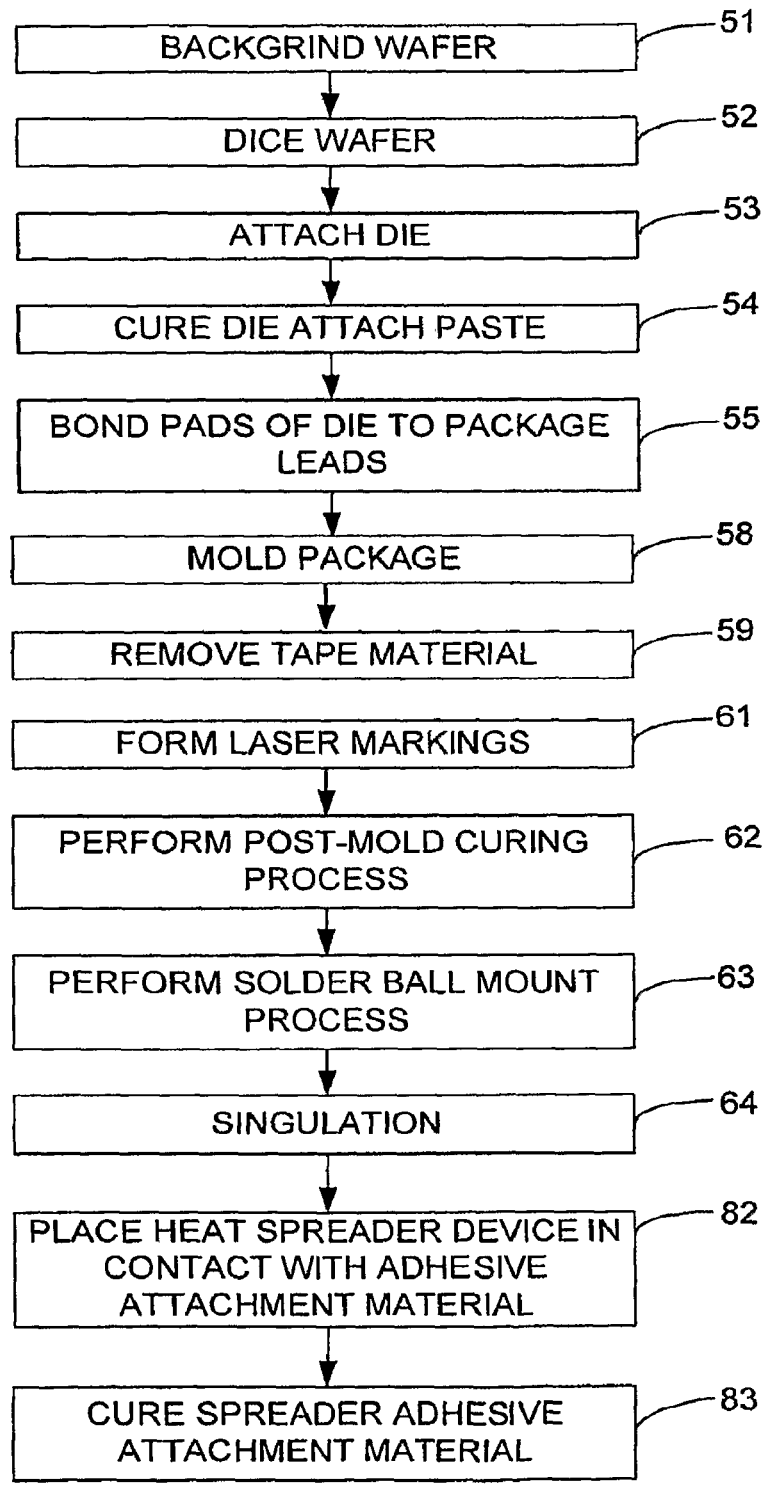
FIG. 6 illustrates a flowchart that represents the assembly process for packaging an IC device and preparing it to be mounted via SMT to a PCB in accordance with an illustrative embodiment of the invention.

FIG. 6 illustrates a flowchart that represents the assembly process for packaging an IC device and preparing it to be mounted via SMT to a PCB in accordance with an illustrative embodiment of the invention. The flowchart shown in FIG. 6 is identical to the flowchart shown in FIG. 4 except that block 59 has been added to represent the process of removing a tape removal and blocks 82 and 83 have been added to represent the process of coupling the heat spreader device and curing the attachment material. This is because, in accordance with this embodiment of the invention, the heat spreader device is coupled after the molding process has been performed, and preferably after the singulation process has been performed. In accordance with this embodiment, the bottom surface of the substrate 34 is pre-taped by laminating the bottom surface of the substrate 34 with an adhesive tape material. Using the adhesive tape material is advantageous because it allows the die to be directly attached to the tape material prior to the molding process (block 58). This pre-taping process may be performed at the wafer level or at the die level. The invention is not limited with regard to when the substrate is pre-taped.

After the molding process represented by block 58 has been performed, the tape material is removed, leaving an adhesive material on the bottom surface of the substrate and die, as indicated by block 59. After the singulation process represented by block 64 has been performed, the top surface of the heat spreader device is placed in contact with the adhesive material located on the bottom surface of the substrate and die, as indicated by block 82. The adhesive attachment material is then cured, as indicated by block 83, which couples the heat spreader device to the substrate. The invention is not limited with regard to when the steps represented by blocks 59, 82 and 83 are performed. By performing these steps after the molding process has been performed, the possibility of mold bleed occurring is reduced or eliminated.

Figure 7:
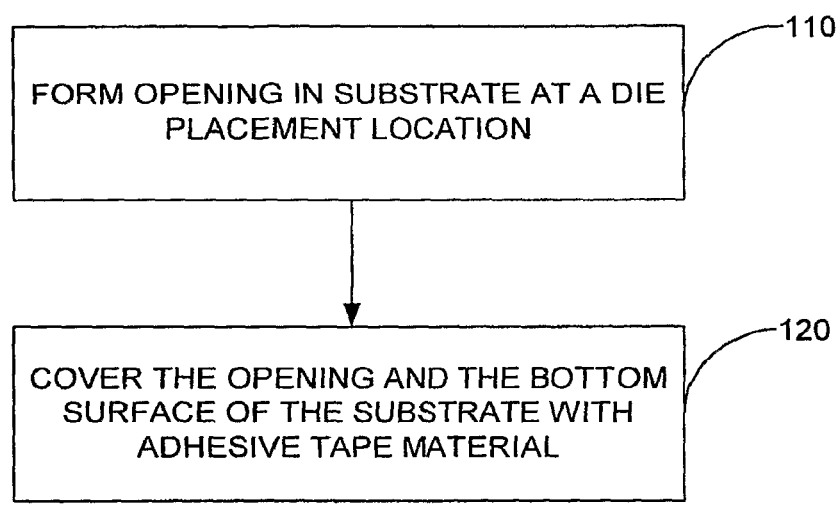
FIG. 7 illustrates a flowchart that represents the process of the invention in accordance with one illustrative embodiment for pre-taping the bottom surface of the substrate and forming an opening in the substrate.

FIG. 7 illustrates a flowchart that represents the process of the invention in accordance with one illustrative embodiment for pre-taping the bottom surface of the substrate and forming an opening in the substrate. An opening is formed in a substrate of an IC device on a bottom portion of the IC device, as indicated by block 110. This opening is formed at the die placement location. The opening may be performed at the wafer level prior to the assembly process or at the die level during the package assembly process. The die may or may not have already been attached to the substrate when the opening is formed in the substrate. For example, the openings could be formed after the backgrinding process corresponding to block 51 has been performed, but prior to the dicing process represented by block 52 being performed. Alternatively, the openings may be performed, for example, after the wire bonding process represented by block 55 has been performed, but before the molding process represented by block 58 has been performed. The invention is not limited with regard to when the opening is formed.

After the opening in the substrate has been formed, the adhesive tape material is placed on the bottom surface of the substrate, as indicated by block 120. It should be noted that it is not necessary that the opening be formed prior to the pre-taping process being performed. The opening may be formed after the pre-taping process has been performed. Thus, the order of the blocks 110 and 120 may be reversed in relation to the order depicted in FIG. 7.

It should be noted that the invention has been described with reference to a few illustrative embodiments for the purposes of demonstrating the principles and concepts of the invention. The invention is not limited to these embodiments. Modifications may be made to the embodiments described herein and all such modifications are within the scope of the invention.

What is claimed is:

1. A method for making a system for dissipating heat in an integrated circuit (IC) package, the method comprising:
   providing a first mold plate;
   providing a second mold plate;
   forming a space within the second mold plate;
   placing a heat spreader device within the space of the second mold plate such that a top surface of the heat spreader device is substantially parallel with a top surface of the second mold plate;
   forming an opening in a substrate at a die placement location;
   positioning the substrate between the first and second mold plates;
   coupling the top surface of the heat spreader device to a bottom surface of the substrate adjacent the opening;
   wherein the opening is formed in the substrate subsequent to the heat spreader device being attached to the substrate.

2. The method of claim 1, further comprising: performing a die attach process, wherein during the die attach process, a bottom surface of an IC die is coupled to the top surface of the heat spreader device through the opening formed in the substrate.

3. The method of claim 2, further comprising: performing a bonding process, wherein during the bonding process, first ends of one or more conductors are connected to one or more conductive pads on a top surface of the die and second ends of said one or more conductors are connected to one or more conductive leads of a leadframe; and performing a molding process, wherein during the molding process, at least the top surface of the die and said one or more conductors are covered with a molding compound.

4. The method of claim 3, wherein the top surface of the heat spreader device is coupled to the bottom surface of the substrate prior to the molding process being performed.

5. The method of claim 4, wherein the top surface of the heat spreader device is coupled to the bottom surface of the substrate prior to the bonding process being performed.

6. The method of claim 5, wherein the top surface of the heat spreader device is coupled to the bottom surface of the substrate prior to the die attach process being performed.

7. The method of claim 2, wherein the opening is formed in the substrate prior to the heat spreader device being attached to the substrate.

8. The method of claim 3, wherein the top surface of the heat spreader device is coupled to the bottom surface of the substrate prior to the molding process being performed and subsequent to the die attach process being performed.

9. The method of claim 4, wherein the top surface of the heat spreader device is attached to the bottom surface of the substrate prior to the molding process being performed and subsequent to the bonding process being performed.

10. The method of claim 1, further comprising: performing a die attach process, wherein during the die attach process, a portion of a bottom surface of an IC die is coupled to a top surface of the substrate over the opening such that a portion of the bottom surface of the die is disposed in the opening above the top surface of the heat spreader device.

11. A method for forming a system for dissipating heat in an integrated circuit (IC) package, the method comprising:
providing a first mold plate;
providing a second mold plate;
forming a space within the second mold plate;
placing a heat spreader device within the space of the second mold plate such that a top surface of the heat spreader device is substantially parallel with a top surface of the second mold plate;
forming an opening in a substrate at a die placement location;
covering the opening and at least a portion of a bottom surface of the substrate with an adhesive tape material;
subsequent to covering the opening and bottom surface of the substrate with the adhesive tape material, removing the tape material, wherein removing the tape material leaves an adhesive material on at least a portion of the bottom surface of the substrate;
positioning the substrate between the first and second mold plates; and
placing a top surface of a heat spreader device in contact with the adhesive material on the bottom surface of the substrate such that when the adhesive material cures, the top surface of the heat spreader device is coupled to the bottom surface of the substrate.

12. The method of claim 11, further comprising: performing a die attach process, wherein during the die attach process, a, bottom surface of the IC die is coupled to the top surface of the heat spreader device through the opening formed in the substrate.

13. The method of claim 12, further comprising: performing a bonding process, wherein during the bonding process, first ends of one or more conductors are connected to one or more conductive pads on a top surface of the die and second ends of said one or more conductors are connected to one or more conductive leads of a leadframe; and performing a molding process, wherein during the molding process at least the top surface of the die and said one or more conductors are covered with a molding compound and one or more molding plates are used to mold the compound.

14. The method of claim 13, wherein the tape material is removed and the top surface of the heat spreader device is coupled to the bottom surface of the substrate subsequent to the molding process being performed.

15. The method of claim 13, wherein the tape material is removed and the top surface of the heat spreader device is coupled to the bottom surface of the substrate prior to the molding process being performed.

16. The method of claim 13, wherein the tape material is removed and the top surface of the heat spreader device is coupled to the bottom surface of the substrate subsequent to the die attach process being performed.

17. The method of claim 11, further comprising: performing a die attach process, wherein during the die attach process, a portion of a bottom surface of an IC die is coupled to a top surface of the substrate over the opening such that a portion of the bottom surface of the die is disposed in the opening above the top surface of the heat spreader device.

* * * * *